United States Patent
Schleicher et al.

(10) Patent No.: US 9,496,875 B1
(45) Date of Patent: **\*Nov. 15, 2016**

(54) OMNIBUS LOGIC ELEMENT

(71) Applicant: Altera Corporation, San Jose, CA (US)

(72) Inventors: James Schleicher, San Jose, CA (US);
Richard Yuan, San Jose, CA (US);
Bruce Pedersen, San Jose, CA (US);
Sinan Kaptanoglu, San Jose, CA (US);
Gregg Baeckler, San Jose, CA (US);
David Lewis, Toronto (CA); Mike Hutton, San Jose, CA (US); Andy L. Lee, San Jose, CA (US); Rahul Saini, San Jose, CA (US); Henry Kim, San Jose, CA (US)

(73) Assignee: Altera Corporation, San Jose, CA (US)

( * ) Notice: Subject to any disclaimer, the term of this patent is extended or adjusted under 35 U.S.C. 154(b) by 115 days.

This patent is subject to a terminal disclaimer.

(21) Appl. No.: 14/501,834

(22) Filed: Sep. 30, 2014

Related U.S. Application Data

(60) Continuation of application No. 14/062,637, filed on Oct. 24, 2013, now Pat. No. 8,878,567, which is a continuation of application No. 13/539,007, filed on Jun. 29, 2012, now Pat. No. 8,593,174, which is a continuation of application No. 13/050,732, filed on Mar. 17, 2011, now Pat. No. 8,237,465, which is a continuation of application No. 12/425,342, filed on Apr. 16, 2009, now Pat. No. 7,911,230, which is a division of application No. 11/607,171, filed on Dec. 1, 2006, now Pat. No. 7,538,579, which is a continuation of application No. 10/810,117, filed on Mar. 25, 2004, now Pat. No. 7,167,022.

(51) Int. Cl.
*H03K 19/0175* (2006.01)
*H03K 19/177* (2006.01)
*G06F 7/50* (2006.01)

(52) U.S. Cl.
CPC ........... *H03K 19/17728* (2013.01); *G06F 7/50* (2013.01); *H03K 19/017581* (2013.01)

(58) Field of Classification Search
None
See application file for complete search history.

(56) References Cited

U.S. PATENT DOCUMENTS

| | | |
|---|---|---|
| 5,260,610 A | 11/1993 | Pedersen et al. |
| 5,260,611 A | 11/1993 | Cliff et al. |
| 5,274,581 A | 12/1993 | Cliff et al. |
| 5,295,090 A | 3/1994 | Hsieh et al. |
| 5,349,250 A | 9/1994 | New |
| 5,359,242 A | 10/1994 | Veenstra |
| 5,359,468 A | 10/1994 | Rhodes et al. |
| 5,365,125 A | 11/1994 | Goetting et al. |
| 5,436,575 A | 7/1995 | Pedersen et al. |
| 5,481,206 A | 1/1996 | New et al. |
| 5,481,486 A * | 1/1996 | Cliff ................. G06F 1/0356 708/235 |

(Continued)

OTHER PUBLICATIONS

Notice of Allowance dated Oct. 9, 2009 from U.S. Appl. No. 12/043,087.

(Continued)

*Primary Examiner* — Tuyet Vo
*Assistant Examiner* — James H Cho
(74) *Attorney, Agent, or Firm* — Fletcher Yoder, P.C.

(57) ABSTRACT

Disclosed is a logic element (LE) that can provide a number of advantageous features. For example, the LE can provide efficient and flexible use of LUTs and input sharing. The LE may also provide for flexible use of one or more dedicated adders and include register functionality.

20 Claims, 4 Drawing Sheets

(56) References Cited

U.S. PATENT DOCUMENTS

| | | |
|---|---|---|
| 5,483,478 A | 1/1996 | Chiang |
| 5,485,103 A | 1/1996 | Pedersen et al. |
| 5,488,316 A | 1/1996 | Freeman et al. |
| 5,500,608 A | 3/1996 | Goetting et al. |
| 5,523,963 A | 6/1996 | Hsieh et al. |
| 5,546,018 A | 8/1996 | New et al. |
| 5,629,886 A | 5/1997 | New |
| 5,631,576 A | 5/1997 | Lee et al. |
| 5,672,985 A | 9/1997 | Lee |
| 5,675,262 A | 10/1997 | Duong et al. |
| 5,724,276 A | 3/1998 | Rose et al. |
| 5,761,099 A | 6/1998 | Pedersen |
| 5,808,942 A | 9/1998 | Sharpe-Geisler |
| 5,818,255 A | 10/1998 | New et al. |
| 5,825,662 A | 10/1998 | Trimberger |
| 5,835,998 A | 11/1998 | Pedersen |
| 5,889,411 A | 3/1999 | Chaudhary |
| 5,898,318 A | 4/1999 | Pedersen |
| 5,898,319 A | 4/1999 | New |
| 5,898,602 A | 4/1999 | Rothman et al. |
| 5,905,385 A | 5/1999 | Sharpe-Geisler |
| 5,909,126 A | 6/1999 | Cliff et al. |
| 5,920,202 A | 7/1999 | Young et al. |
| 5,926,036 A | 7/1999 | Cliff et al. |
| 5,999,016 A | 12/1999 | McClintock et al. |
| 6,021,423 A | 2/2000 | Nag et al. |
| 6,051,992 A | 4/2000 | Young et al. |
| 6,107,827 A | 8/2000 | Young et al. |
| 6,118,300 A | 9/2000 | Wittig et al. |
| 6,124,731 A | 9/2000 | Young et al. |
| 6,154,052 A | 11/2000 | New |
| 6,154,053 A | 11/2000 | New |
| 6,154,055 A | 11/2000 | Cliff et al. |
| 6,157,209 A | 12/2000 | McGettigan |
| 6,184,707 B1 | 2/2001 | Norman et al. |
| 6,191,610 B1 | 2/2001 | Wittig et al. |
| 6,191,611 B1 | 2/2001 | Altaf |
| 6,201,408 B1 | 3/2001 | Skahill et al. |
| 6,236,229 B1 | 5/2001 | Or-Bach |
| 6,288,568 B1 | 9/2001 | Bauer et al. |
| 6,288,570 B1 | 9/2001 | New |
| 6,292,021 B1 | 9/2001 | Furtek et al. |
| 6,294,928 B1 | 9/2001 | Lytle et al. |
| 6,297,665 B1 | 10/2001 | Bauer et al. |
| 6,323,682 B1 | 11/2001 | Bauer et al. |
| 6,380,759 B1 | 4/2002 | Agrawal et al. |
| 6,400,180 B2 | 6/2002 | Wittig et al. |
| 6,414,514 B1 | 7/2002 | Heile |
| 6,476,636 B1 | 11/2002 | Lien et al. |
| 6,501,296 B2 | 12/2002 | Wittig et al. |
| 6,556,042 B1 | 4/2003 | Kaviani |
| 6,642,744 B2 | 11/2003 | Or-Bach et al. |
| 6,703,862 B1 | 3/2004 | Bilski |
| 6,744,278 B1 | 6/2004 | Liu et al. |
| 6,747,480 B1 | 6/2004 | Kaptanoglu et al. |
| 6,798,240 B1 | 9/2004 | Pedersen |
| 6,879,185 B2 | 4/2005 | Swami et al. |
| 6,888,373 B2 | 5/2005 | Kaptanoglu et al. |
| 6,943,580 B2 | 9/2005 | Lewis et al. |
| 7,167,022 B1 | 1/2007 | Schleicher et al. |
| 7,185,035 B1 | 2/2007 | Lewis et al. |
| 7,188,266 B1 | 3/2007 | Mendel et al. |
| 7,317,330 B2 | 1/2008 | Pedersen |
| 7,538,579 B1 | 5/2009 | Schleicher et al. |
| 7,558,812 B1 | 7/2009 | Padalia et al. |
| 7,565,388 B1 | 7/2009 | Baeckler et al. |
| 7,671,625 B1 | 3/2010 | Schleicher et al. |
| 7,911,230 B1 | 3/2011 | Schleicher et al. |
| 8,237,465 B1 | 8/2012 | Schleicher et al. |
| 8,593,174 B1 | 11/2013 | Schleicher et al. |
| 8,878,567 B1 | 11/2014 | Schleicher et al. |
| 2001/0049816 A1* | 12/2001 | Rupp ............... H03K 19/17796 708/230 |
| 2004/0145942 A1* | 7/2004 | Leijten-Nowak .. H03K 19/1737 365/154 |
| 2004/0178818 A1 | 9/2004 | Crotty et al. |
| 2006/0176075 A1 | 8/2006 | Or-Bach |

OTHER PUBLICATIONS

Office Action dated Apr. 30, 2009 from U.S. Appl. No. 12/043,087.
Notice of Allowance dated Nov. 15, 2006 from U.S. Appl. No. 10/810,117.
Office Action dated Jul. 26, 2006 from U.S. Appl. No. 10/810,117.
Office Action dated May 3, 2006 from U.S. Appl. No. 10/810,117.
Advisory Action dated Mar. 28, 2006 from U.S. Appl. No. 10/810,117.
Final Office Action dated Jan. 10, 2006 from U.S. Appl. No. 10/810,117.
Notice of Allowance dated Jan. 16, 2009 from U.S. Appl. No. 11/607,171.
Notice of Allowance dated Oct. 8, 2008 from U.S. Appl. No. 11/607,171.
Office Action dated Mar. 18, 2008 from U.S. Appl. No. 11/607,171.
Final Office Action dated Dec. 14, 2007 from U.S. Appl. No. 11/607,171.
Office Action dated Jul. 25, 2007 from U.S. Appl. No. 11/607,171.
Notice of Allowance dated Nov. 15, 2010 from U.S. Appl. No. 12/425,342.
Office Action dated Oct. 30, 2009 from U.S. Appl. No. 12/425,342.
Final Office Action dated Jul. 14, 2010 from U.S. Appl. No. 12/425,342.
Office Action dated Sep. 12, 2011 from U.S. Appl. No. 13/050,732.
Final Office Action dated Feb. 17, 2012 from U.S. Appl. No. 13/050,732.
U.S. Notice of Allowance dated Apr. 16, 2012 from U.S. Appl. No. 13/050,732.
Office Action dated Apr. 3, 2013 from U.S. Appl. No. 13/539,007.
Notice of Allowance dated Jul. 24, 2013 from U.S. Appl. No. 13/539,007.
Notice of Allowance dated Jul. 11, 2014 from U.S. Appl. No. 14/062,637.
Office Action dated Mar. 21, 2014 from U.S. Appl. No. 14/062,637.
E. Ahmed et al., "The Effect of LUT and Cluster Size on Deep-Submicron FPGA Performance and Density," FPGA 2000 Monterey, CA, pp. 3-12.
D. Cherepacha et al., "DP-FPGA: An FPGA Architecture Optimized for Datapaths," VLSI Design 1996, vol. 4, No. 4, pp. 329-343.
S. Kaptanoglu et al., "A new high density and very low cost reprogrammable FPGA architecture," FPGA 99 Monterey CA, Feb. 21-23, 1999, pp. 3-12.
J. Rose et al., "Architecture of Field-Programmable Gate Arrays: The Effect of Logic Block Functionality on Area Efficiency," J. of Solid-State circuits, vol. 25, No. 5, Oct. 1990, pp. 1217-1224.
J. L. Kouloheris et al., "FPGA Area versus Cell Granularity-Lookup Tables and PLA Cells," FPGA, 1992, pp. 9-14.
"FLEX 8000 Programmable Logic Device Family," Altera Corp. Jun. 1999, ver. 10.01, pp. 349-364.
"FLEX 10K Embedded Programmable Logic Device Family," Altera Corp. Mar. 2001, ver. 4.1, pp. 1-28.
"FLEX 6000 Programmable Logic Device Family," Altera Corp., Mar. 2001, ver. 4.1, pp. 1-17.
"Mercury Programmable Logic Device Family," Altera Corp., Mar. 2002, ver. 2.0, pp. 1-34.
"APEX 20K Programmable Logic Device Family," Altera Corp., Feb. 2002, ver. 4.3, pp. 1-29.
"Virtex.TM—II Platform FPGAS: Detailed Description," XILINX, Advance Product Specification, v2.1.1, Dec. 6, 2002, 40 pgs.
"Stratix FPGA Family Data Sheet," Altera Corp., Dec. 2002, Preliminary Information, pp. 11-19.

* cited by examiner

OMNIBUS LOGIC ELEMENT

CROSS-REFERENCE TO RELATED APPLICATIONS

This application is a continuation of and claims priority to and the benefit, under 35 U.S.C. §120, of co-pending U.S. patent application Ser. No. 14/062,637 titled "Omnibus Logic Element", filed on Oct. 24, 2013, which is a continuation of and claims priority to and the benefit, under 35 U.S.C. §120, U.S. patent application Ser. No. 13/539,007 titled "Omnibus Logic Element for Packing or Fracturing", filed on Jun. 29, 2012, now issued as U.S. Pat. No. 8,593,174, which is a continuation of and claims priority to and the benefit, under 35 U.S.C. §120, of U.S. patent application Ser. No. 13/050,732 titled "Omnibus Logic Element For Packing Or Fracturing", filed on Mar. 17, 2011, now issued as U.S. Pat. No. 8,237,465, which is a continuation of and claims priority to and the benefit, under 35 U.S.C. §120, of U.S. patent application Ser. No. 12/425,342 titled "Omnibus Logic Element For Packing Or Fracturing", filed on Apr. 16, 2009, now issued as U.S. Pat. No. 7,911,230, which is a divisional and claims priority to and the benefit, under 35 U.S.C. §120, of U.S. patent application Ser. No. 11/607,171 titled "Omnibus Logic Element", filed on Dec. 1, 2006, now issued as U.S. Pat. No. 7,538,579, which is a continuation of and claims priority to and the benefit, under 35 U.S.C. §120, of U.S. patent application Ser. No. 10/810,117 titled "Omnibus Logic Element Including Look Up Table Based Logic Elements", filed on Mar. 25, 2004, now issued as U.S. Pat. No. 7,167,022, all of which are incorporated herein by reference in their entirety for all purposes.

FIELD OF THE INVENTION

The present invention relates to logic elements for use with programmable logic devices or other similar devices.

BACKGROUND

Programmable logic devices ("PLDs") (also sometimes referred to as CPLDs, PALs, PLAs, FPLAs, EPLDs, EEPLDs, LCAs, FPGAs, or by other names), are well-known integrated circuits that provide the advantages of fixed integrated circuits with the flexibility of custom integrated circuits. Such devices are well known in the art and typically provide an "off the shelf" device having at least a portion that can be electrically programmed to meet a user's needs. Application specific integrated circuits ("ASICs") have traditionally been fixed integrated circuits, however, it is possible to provide an ASIC that has a portion or portions that are programmable; thus, it is possible for an integrated circuit device to have qualities of both an ASIC and a PLD. The term PLD as used herein will be considered broad enough to include such devices.

PLDs typically include blocks of logic elements, sometimes referred to as logic array blocks ("LABs"; also referred to by other names, e.g., "configurable logic blocks," or "CLBs"). Logic elements ("LEs", also referred to by other names, e.g., "logic cells") may include a look-up table (LUT) or product term, carry-out chain, register, and other elements.

Logic elements, including look-up table (LUT)-based logic elements, typically include configurable elements holding configuration data that determines the particular function or functions carried out by the logic element. A typical LUT circuit may include ram bits that hold data (a "1" or "0"). However, other types of configurable elements may be used. Some examples may include static or dynamic random access memory, electrically erasable read-only memory, flash, fuse, and anti-fuse programmable connections. The programming of configuration elements could also be implemented through mask programming during fabrication of the device. While mask programming may have disadvantages relative to some of the field programmable options already listed, it may be useful in high volume applications. For purposes herein, the generic term "memory element" will be used to refer to any programmable element that may be configured to determine functions implemented by other PLD.

A typical LUT circuit used as a logic element provides an output signal that is a function of multiple input signals. The particular logic function may be determined by programming the LUT's memory elements. As will be explained further herein (see FIG. 1 and accompanying text), a typical LUT circuit may be represented as a plurality of memory elements coupled to a "tree" of 2:1 muxes. The LUT mux tree includes a first level comprising a single 2:1 mux providing the LUT output and also includes successive additional levels of muxes, each level including twice as many muxes as the previous level and the number of memory elements being twice as many as the number of 2:1 muxes in a last mux level coupled to the memory elements. Each 2:1 mux level provides a logic input to the LUT circuit coupled to control inputs of the muxes at that mux level. Thus, to obtain an n-input LUT (or "nLUT") typically requires 2n memory elements and 2n muxes. Adding an input to an nLUT circuit to provide an n+1 input LUT ("(n+1)LUT") therefore typically requires providing a total of 2n+1 memory elements and (2n+1−1) muxes, i.e., approximately a doubling of resources relative to that required by an nLUT.

For many applications, the functions that need to be implemented by a first LUT circuit and a second LUT circuit are identical. Also, for some applications, it may be possible for inputs of first and second LUT circuits to be shared without reducing the functionality required by the application. In such instances opportunities are presented for sharing resources to reduce the total number of memory elements and multiplexers that would otherwise be required.

In addition to LUT operations, some LEs have included specialized circuitry to perform arithmetic operations efficiently. However, these examples have typically been limited to simple arithmetic operations (e.g., an addition of two inputs) and have generally not exploited internal LUT structures. Increasing the capability of a logic element to perform more complex arithmetic functions while adding a small amount of additional logic can significantly increase the effective logic density of a LE and thereby decrease costs.

Additionally, some LEs include registers to perform sequential logic functions. However, it is sometimes the case the logic function carried out by an LE does not require a register. And, it may be the case that a logic function carried out in another LE requires the use of a register. Thus, if an LE includes a register, it can be advantageous to make that register available to outputs of logic functions carried out outside the LE.

BRIEF SUMMARY OF THE INVENTION

Disclosed is an LE that can provide a number of advantageous features. For example, the LE can provide efficient and flexible use of LUTs and input sharing. The LE may also provide for flexible use of one or more dedicated adders and include register functionality. In particular, an logic circuit in accordance with the present invention may include a plurality of look up tables ("LUTs") driven by a plurality of inputs. Each of the plurality of LUTs is included either in a first group of LUTs or a second group of LUTs and at least one of the plurality of inputs drives each of the plurality of LUTs. At least a second of the plurality of inputs drives each LUT in the first group of LUTs and is connectable to drive at least one of the LUTs in the second group of LUTs. At least a third of the plurality of inputs is connectable to drive at least one of the LUTs in the first group of LUTs. At least two LUTs in the first group of LUTs drives a first multiplexer ("MUX") and a second MUX. And, at least a fourth of the plurality of inputs drives a control input of the first MUX. In another aspect of the invention, the logic circuit can also include at least one register.

In another aspect of the present invention, an logic circuit can include a plurality of inputs, a first plurality of look-up tables ("LUTs") which can be driven by at least a first portion of the inputs, and a second plurality of LUTs which can be driven by at least a second portion of the inputs. The LE can also include a first plurality of multiplexers ("MUXs") which can be driven by at least a portion of the first plurality of LUTs and a second plurality of MUXs which can be driven by at least a portion of the second plurality of LUTs. The LE can also include at least a first adder and a second adder wherein the first adder is driven by one of the first plurality of LUTs and either one of the first plurality of multiplexers or a share-in input to the logic circuit. The second adder is driven by one of the second plurality of LUTs and either one of the second plurality of multiplexers or one of the first plurality of multiplexers.

In another aspect of the invention, the logic circuit can be configured to separately carry out a first 6-input logic function and a second 6-input logic function, the first 6-input logic function sharing at least 4 inputs with the second 6-input logic function; or a first 5-input logic function and a second 5-input logic function, the first 5-input logic function sharing at least 2 inputs with the second 5-input logic function.

In another aspect of the invention, the logic circuit can include a first register and a second register wherein the first register can be driven by either one of the first plurality of MUXs or an output of the first adder and the second register can be driven by either one of the second plurality of MUXs or an output of the second adder.

Additional aspects of the present invention are presented below and in the claims.

DETAILED DESCRIPTION OF THE INVENTION

Figure 1:
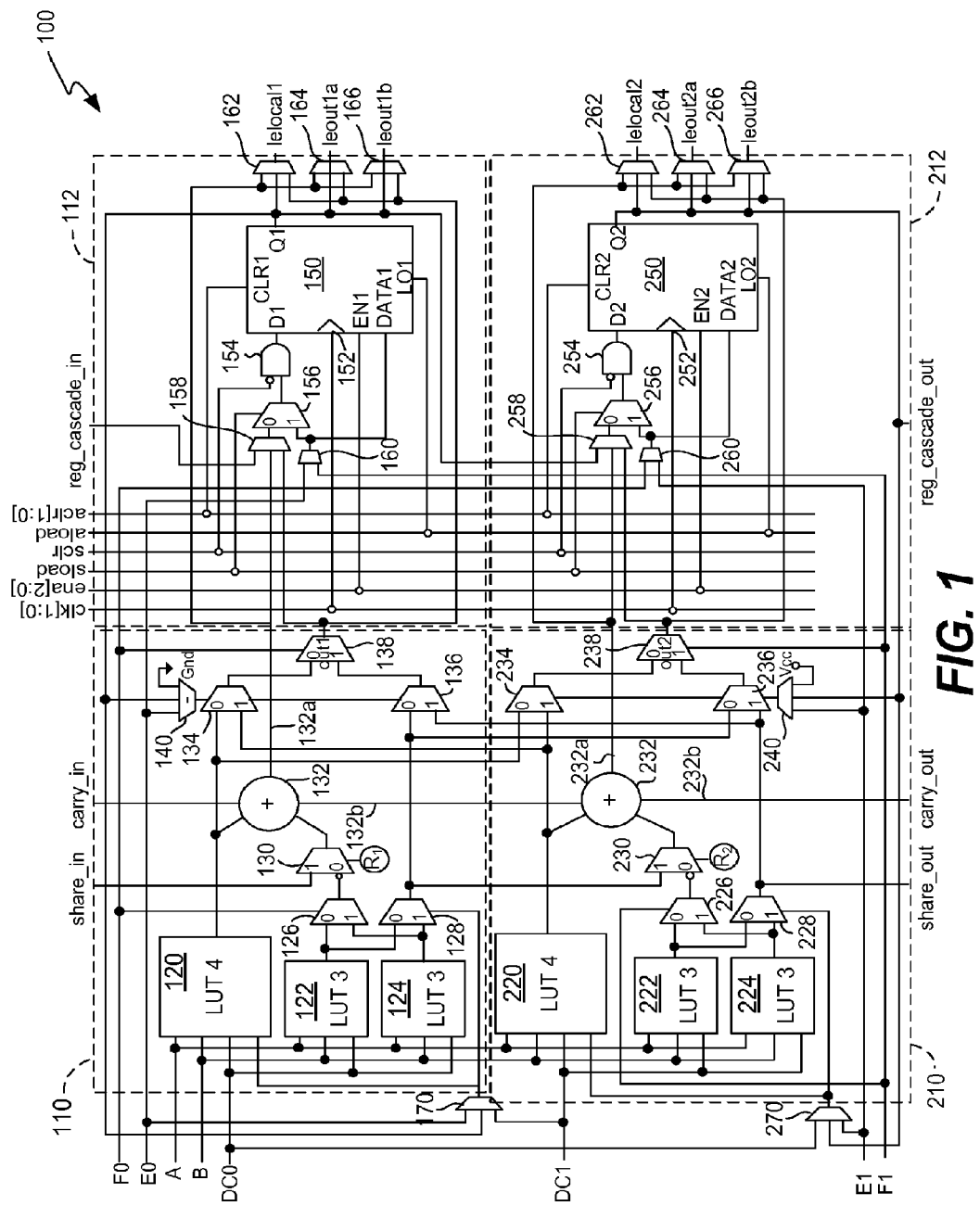
FIG. 1 is a schematic diagram of a logic element in accordance with the present invention.

FIG. 1 illustrates a logic element ("LE") 100 in accordance with the present invention. Logic element 100 includes a number of features, each discussed in detail below, to increase flexibility and efficiency thereof.

General Layout

To clarify description, LE 100 can be divided into four parts: a first arithmetic portion 110 associated with a first register portion 112 and a second arithmetic portion 210 associated with a second register portion 212. First arithmetic portion 110 and second arithmetic portion 210 each include 3 lookup tables (LUTs). First arithmetic portion 110 includes a first 4 input LUT (4LUT) 120, first 3LUT 122 and second 3LUT 124, second arithmetic portion 210 includes second 4LUT 220, third 3LUT 222 and fourth 3LUT 224. First and second 3-LUT 122 and 124 drive 2, 2 input multiplexers (2MUXs) 126 and 128 of first arithmetic portion 110. Similarly, third 3LUT 222 and fourth 3LUT 224 each drive 2 input multiplexers (2MUXs) 226 and 228 of second arithmetic portion 210.

In first arithmetic portion 110, 2MUX 126 drives one input of a share 2MUX 130 which, in turn, drives one input of a first adder 132. A second input of share 2MUX 130 is driven by a share-in input which is driven by an adjacent LE (not shown). In second arithmetic portion 210, 2MUX 226 drives one input of a share 2MUX 230 which, in turn, drives one input of a second adder 232. A second input of share 2MUX 230 is driven by the output of 2MUX 128. As discussed in detail below, share 2MUXs 130 and 230 allow a signal driven by an adjacent LUT or LE to be included in a arithmetic function.

First arithmetic portion 110 also includes first fracturing 2-MUX 134 and second fracturing 2-MUX 136. First fracturing 2MUX is driven by first 4LUT 120 and second 4LUT 220 and second fracturing 2MUX is driven by 2MUX 128 and 2MUX 228. Also, first fracturing 3MUX 140 drives the selection inputs of both first and second fracturing 2MUXs 134 and 136. First fracturing 3MUX 140 is driven by input E0, output Q1 of first register 150, discussed below, and a ground input Gnd. Second arithmetic portion 210 includes a third fracturing 2MUX 234 and a fourth fracturing 2MUX 236. Third fracturing 2MUX 234 is driven by first 4LUT 120 and second 4LUT 220 and fourth fracturing 2MUX 236 is driven by 2MUX 128 and 2MUX 228. A second fracturing 3MUX 240 is driven by input E1, a Q2 output of second register 250, discussed below, and a supply voltage signal Vcc. Second fracturing 3MUX 240 drives the selection inputs of both third fracturing 2MUX 234 and fourth fracturing 2MUX 236. As discussed in detail below, fracturing 2MUXs 134, 136, 234 and 236 and fracturing 3MUXs 140 and 240 allow LE 100 to be fractured to provide independent combinational functions which may share inputs.

A first combinational output OUT1 of first arithmetic portion 110 is driven by first combinational output 2MUX 138 and a second combinational output OUT2 of second arithmetic portion 210 is driven by second combinational output 2MUX 238. First combinational output 2MUX 138 is driven by first fracturing 2MUX 134 and second fracturing 2MUX 136. Second combinational output 2MUX 238 is driven by first fracturing 2MUX 234 and second fracturing 2MUX 236.

LE 100 includes 8 signal inputs A, B, DC0, DC1, E0, F0, E1 and F1. Inputs A and B are always shared and drive 4LUTs 120 and 220 and 3LUTS 122, 124, 222 and 224. Input DC0 always drives 4LUT 120 and 3LUTS 122 and 124 of first arithmetic portion. Additionally, input DC0 may be shared with second arithmetic portion 210 through second input 3MUX 270, through which input DC0 may also drive second 4LUT 220 and 2MUX 228. Input DC1 always drives second 4LUT 220 and 3LUTs 222 and 224 of second arithmetic portion 210. Additionally, input DC1 may be shared with first arithmetic portion 110 through first input 3MUX 170, through which input DC1 may also drive first 4LUT 120 and the selection input for 2MUX 128. Input E0 feeds first input 3MUX 170, first fracturing 3MUX 140, discussed above, and first bypass 2MUX 160 of first register portion 112, which will be further discussed below. Input E1 feeds second input 3MUX 270, second fracturing 3MUX 240 and second bypass 2MUX 260 of second register portion 212, which will be further discussed below. Input F0 drives the selection input of 2MUX 126, the selection input of first combinational output 2MUX 138 and second bypass 2MUX 260 of second register portion 212. Input F1 drives the selection input of 2MUX 226, the selection input of second combinational output 2MUX 238 and first bypass 2MUX 160 of first register portion 112.

First combinational output OUT1 of first arithmetic portion 110 drives first register portion 112 and second combinational output OUT2 of second arithmetic portion 210 drives second register portion 212. First register portion 112 includes a first register 150 and second register portion 212 includes a second register 250. As is well understood in the art, registers 150 and 250 include clear inputs CLR1 and CLR2, respectively, each driven by one of two aclr1 and aclr0 signals, asynchronous load inputs LD1 and LD2 respectively, each driven by an aload signal, clock enable inputs EN1 and EN2, respectively, driven by one of three ena2, ena1 and ena0 signals, and a clock input 152 and 252, respectively, each driven by one of clk1 and clk0 signals. Clear signals, asynchronous load signals, clock enable signals, and clock signals are all well understood by those skilled in the art.

Input D1 of first register 150 is driven by a first AND gate 154 which is driven by an inverted sclr signal and the output from a first packing 2MUX 156, which, as explained in detail below, allows first register 150 to be driven either by first arithmetic portion 110, an LE input E0 or F1, or a cascaded register outside of LE 100. Packing 2MUX 156 is driven by a first 3MUX 158, which is driven by a register cascade in input, the output from first adder 132 and first arithmetic portion output OUT1. A second input of first packing 2MUX 156 is driven by first bypass 2MUX 160 which is driven by LE input E0 and LE input F1. First bypass 2MUX 160 also drives a DATA1 input of register 150.

Regarding second register portion 250, input D2 of second register 250 is driven by a second AND gate 254 which is driven by an inverted sclr signal and the output from a second packing 2MUX 156, which, as explained in detail below, allows second register 250 to be driven either by second arithmetic portion 210, an LE input E1 or F0, or output Q1 of first register 150. Packing 2MUX 256 is driven by a second register 3MUX 258, which is driven by first register output Q1, the output from second adder 232 and second arithmetic portion output OUT2. A second input of second packing 2MUX 256 is driven by second bypass 2MUX 260 which is driven by LE input E1 and LE input F0. Second bypass 2MUX 260 also drives a DATA2 input of second register 250.

First register portion 112 includes 3 outputs; lelocal1, driven by first output 3MUX 162; leout1a, driven by second output 3MUX 164; and leout1b, driven by third output 3MUX 166. Second register portion 212 also includes 3 outputs; lelocal2, driven by fourth output 3MUX 262; leout2a, driven by fifth output 3MUX 264, and leout2d, driven by sixth output 3MUX 266. Output 3MUXs 162, 164 and 166 of first register portion 112 are each driven by the output of first adder 132, an output Q1 of first register 150 and first arithmetic portion output OUT1. Thus, any of these three signals can drive an output of first register portion 112. Output 3MUXs 262, 264 and 266 of second register portion 212 are each driven by the output of second adder 232, an output Q2 of second register 250 and second arithmetic portion output OUT2. Thus, any of these three signals can drive an output of second register portion 212.

Combinatorial Implementation

For many applications in LEs, the functions that need to be implemented by a first LUT circuit and a second LUT circuit in the LE are identical. Also, for some applications, it may be possible for inputs of first and second LUT circuits to be shared without reducing the functionality required by the application. In such instances opportunities are presented for sharing resources to reduce the total number of memory elements and muxes that would otherwise be required.

In other instances, while also minimizing resources, it is useful to have the flexibility to switch between two nLUT circuits that may be independently programmed to implement n-input functions and two (n+1)LUT circuits that can be programmed to implement the same n+1-input functions. It may also be desirable to, with minimal added resources, have the added flexibility to select an additional option such as, for example, two LUT circuits that can implement at least some functions of n+2 inputs. LE's configured with such capabilities include what are referred to herein as shared LUT masks (or SLMs). Shared LUT masks are discussed in detail in commonly owned U.S. patent application Ser. No. 10/351,026 for Logic Circuitry with Shared Lookup Table, now issued U.S. Pat. No. 6,798,240, which is incorporated by reference in its entirety.

LE 100 includes SLM configuration. In particular, LE 100 is fracturable, that is, LE 100 includes sufficient inputs to carry out 6-input logic functions and LE 100 can be fractured to carry out two 6 or fewer input logic functions having some shared inputs. Because LE 100 includes eight signal inputs, A, B, DC0, DC1, E0, E1, F0 and F1, LE 100 can carry out two 6-input functions that share at least 4 inputs, two 5-input functions that share at least 2 inputs or two 4-input functions without sharing any inputs.

To facilitate fracturing of LE 100, inputs A and B drive each of LUTs 120, 122, 124, 220, 222 and 224. Input DC0 drives LUTs 120, 122 and 124 and second input 3MUX 270 can be configured to allow input DC0 to drive LUT 220 and the control input of 2MUX 228. First input 3MUX 170 can be configured to allow input E0 to drive 4LUT 120 and the control input of 2MUX 128. Input F0 drives the control input of 2MUXs 126 and 138. Additionally, input DC1 drives 4LUT 220, and 3LUTs 222 and 224 and first input 3LUT 170 can be configured to allow input DC1 to drive 4LUT 120 and the control input of 2MUX 128. Second input 3LUT 270 can be configured to allow input E1 to drive 4LUT 220 and the control input of 2MUX 228. And, input F1 drives the control input of 2MUXs 226 and 238.

LE 100 is fractured by appropriately configuring input 3MUXs 140, 240, 170 and 270. For example, it is possible to configure LE 100 such that the result of a first 6-input logic function Fa of signals on inputs A, B, DC0, DC1 E0 and F0 is placed on first arithmetic portion output OUT1 and the result of a second 6-input logic function Fb of signals on inputs A, B, DC0, DC1, E1 and F1 is placed on second arithmetic portion output OUT2. That is, LE 100 can be configured to carry out two 6-input functions sharing inputs A, B, DC0 and DC1. To configure LE 100 in this manner, the E0 signal is passed by input 3MUX 140 to selection inputs of 2MUX 134 and 2MUX 136. In this way, 2MUX 134 will be driven by 4LUT 120 and 4LUT 220. Similarly 2MUX 136 will be driven by 2MUXs 128 and 228. Also, input 3MUX 240 is configured to pass E1 through to selection input of 2MUX 234 and 2MUX 236. In this way, 2MUX 234 is driven by second 4LUT 120 and 4LUT 220. Similarly 2MUX 236 is driven by 2MUXs 128 and 228. Also, input 3MUX 170 is configured such that input DC1 drives first 4LUT 120 and the selection input of 2MUX 128 and input 3MUX 270 is configured such that input DC0 drives second 4LUT 220 and the selection input of 2MUX 228.

As is well understood in the art, 4LUTs 120 and 220 and 3LUTs 122, 124, 222 and 224 can be configured to carry out Fa and Fb.

LE 100 is fractured by appropriately configuring input 3MUXs 140, 240, 170 and 270. A first 5-input function Fa' of signals on inputs A, B, DC0, E0 and F0 can be carried out and provided on first arithmetic portion 110 output OUT1 and a second 5-input function Fb' of signals on inputs A, B, DC1, E1 and F1. That is, LE 100 can carry out two, 5-input functions sharing the two inputs A and B. Fracturing of LE 100 also allows a first 4-input function Fa" of signals A, DC0, E0 and F0 can be carried out and provided on first arithmetic portion 110 output OUT1 and a second 4-input function Fb" of signals on inputs B, DC1, E1 and F1. That is, LE 100 can carry out two, 4-input functions without sharing any inputs. To configure LE 100 in this manner, the GND signal is passed by input 3MUX 140 to selection inputs of 2MUX 134 and 2MUX 136. In this way, 2MUX 134 will be driven by 4LUT 120. Similarly 2MUX 136 will be driven by 2MUX 128. Also, input 3MUX 240 is configured to pass VCC through to selection input of 2MUX 234 and 2MUX 236. In this way, 2MUX 234 is driven by second 4LUT 220. Similarly 2MUX 236 is driven by 2MUX 228. Also, input 3MUX 170 is configured such that input E0 drives first 4LUT 120 and the selection input of 2MUX 128 and input 3MUX 270 is configured such that input E1 drives second 4LUT 220 and the selection input of 2MUX 228.

As is well understood in the art, 4LUT 120 and 3LUTs 122 and 124 can be configured to carry out Fa" and 4LUT 220 and 3LUTs 222 and 224 can be configured to carry out Fb".

The output of Fa" on first arithmetic portion output 138 can be provided on outputs lelocal1, leout1a and/or leout1b by appropriately configuring output 3MUXs 162, 164 and 166, respectively. Similarly, output of Fb" on second arithmetic portion output 238 can be provided on outputs lelocal2, leout2a and/or leout2b by appropriately configuring output 3MUXs 262, 264 and/or 266, respectively. The output of Fa" can also be provided to first register portion 112 through 3MUX 158 for further processing and the output of Fb" can be provided to second register portion 212 through 3MUX 258 for further processing.

Extended LUT Mode

LE 100 can generate some functions of 7-inputs by appropriately configuring input 3MUXs 140, 240, 170 and 270. For example, it is possible to configure LE 100 such that the result of a first 7-input logic function Fa'" of signals on inputs A, B, DC0, DC1 E0, E1 and F0 is placed on first arithmetic portion output OUT1. To configure LE 100 in this manner, the E0 signal is passed by input 3MUX 140 to selection inputs of 2MUX 134 and 2MUX 136. In this way, 2MUX 134 will be driven by 4LUT 120 and 4LUT 220. Similarly 2MUX 136 will be driven by 2MUXs 128 and 228. Also, input 3MUX 170 is configured such that input DC1 drives first 4LUT 120 and the selection input of 2MUX 128 and input 3MUX 270 is configured such that input E1 drives second 4LUT 220 and the selection input of 2MUX 228. In this manner output Fa'" implements the function MUX(F1(A, B, DC0, DC1, E0), F2(A, B, DC1, E0, E1)), where F0 is used as the mux select line.

Symmetrically, it is possible to configure LE 100 such that the result of a second 7-input logic function Fb'" of signals on inputs A, B, DC0, DC1 E0, E1 and F1 is placed on second arithmetic portion output OUT2. To configure LE 100 in this manner, the E1 signal is passed by input 3MUX 240 to selection inputs of 2MUX 234 and 2MUX 236. In this way, 2MUX 234 will be driven by 4LUT 120 and 4LUT 220. Similarly 2MUX 236 will be driven by 2MUXs 128 and 228. Also, input 3MUX 170 is configured such that input EU drives first 4LUT 120 and the selection input of 2MUX 128 and input 3MUX 270 is configured such that input DC0 drives second 4LUT 220 and the selection input of 2MUX 228. In this manner output Fb'" implements the function MUX(F1(A, B, DC0, DC1, E1), F2(A, B, DC0, E0, E1), where F1 is used as the mux select line.

Register Packing

As discussed above, LE 100 includes 2 register portions 112 and 212. If required for a given logic function, first register portion 112 may be driven by OUT1 of first combinatorial portion 110 through 3MUX 158 and second register portion 212 may be driven by OUT2 of second combinatorial portion 210 through 3MUX 258. However, it can be the case that either or both OUT1 and OUT2 are taken directly out of LE 100, that is, register portions 112 and 212 are bypassed. Also, it is possible that at the same time a logic function being carried out outside of an LE will require more than one register. In such a case, an LE in accordance with the present invention can provide one or two additional register to a logic function from outside the LE. That is, an LE in accordance with the present invention can be "packed".

In particular, to perform a single, 6-input logic function in first combinatorial portion 110, inputs F0, E0, A, B, DC0, and DC1 would be used. If this function required use of a register, then 3MUX 158 of first register portion 112 could be set to pass the signal from OUT1 and first register portion 112 would not be available. However, if LE 100 is carrying out a single logic function, second register portion 212 would not be used. Further, neither input E1 nor F1 are being used for the 6-input logic function. And, input E1 feeds second bypass 2MUX 260. The output of second bypass 2MUX 260 drives the D2 input of second register 250 when bypass 2MUX 260 is selected by synchronous load signal sload via 2MUX 256. In this way, a signal generated by a logic function carried out outside of LE 100 can drive second register 250 through input E1. Similarly, because input F1 can be routed to register 150 via 2MUX 160, if register 150 is not being used by LE 100, then a logic function requiring an extra register can access register 150 via input F1. Further, if neither register 150 nor register 250 are required by LE 100 for a particular logic function, the both registers may by packed, register 150 being accessed through input F1 and register 250 being accessed through input E1.

In particular, to perform a single, 6-input logic function in second combinatorial portion 210, inputs F1, E1, A, B, DC0, and DC1 would be used. If this function required use of a register, then 3MUX 258 of second register portion 212 could be set to pass the signal from OUT2 and second register portion 212 would not be available. However, if LE 100 is carrying out a single logic function, first register portion 112 would not be used. Further, neither input E0 nor F0 are being used for the 6-input logic function. And, input E0 feeds first bypass 2MUX 160. The output of first bypass 2MUX 160 drives the D1 input of first register 150 when bypass 2MUX 160 is selected by synchronous load signal sload via 2MUX 156. In this way, a signal generated by a logic function carried out outside of LE 100 can drive first register 150 through input EU. Similarly, because input F0 can be routed to register 250 via 2MUX 260, if register 250 is not being used by LE 100, then a logic function requiring an extra register can access register 250 via input F0. Further, if neither register 150 nor register 250 are required by LE 100 for a particular logic function, the both registers may by packed, register 150 being accessed through input E0 and register 250 being accessed through input F0.

Register Feedback MUXs

In configuring some logic functions, it may be desirable to route the output of a register back into the input of the LE (or, in particular, a LUT in the LE). This is useful when the register feeds this LUT to conserve routing resources and logic area. In LE 100, the output Q1 of first register 150 feeds first input 3MUX 170 and the output Q2 of second register 250 feeds second input 3MUX 270. In this way, the output Q1 of first register 150 may be fed back into first combinatorial portion 110 of LE 100 and the output Q2 of second register 250 may be fed back into second combinatorial portion 210 of LE 100.

Arithmetic Implementation

As discussed above, it can be desirable to include dedicated arithmetic structures in an LE to facilitate the ability to carry out arithmetic functions. Such arithmetic structures are described in general in commonly owned pending U.S. patent application Ser. No. 10/693,576 for Arithmetic Structures for Programmable Logic Devices, which is incorporated by reference in it entirety.

LE 100 preferably includes such arithmetic structures. In particular, LE 100 includes a first adder 132, which is part of first combinatorial portion 110 and a second adder 232, which is part of second combinatorial portion 210. First adder 132 is driven by three signals; an output of share 2MUX 130, an output of 4LUT 120 and a carry in signal which, in turn, can be driven by a carry out signal from an adjacent LE (not shown). Similarly, second adder 232 is driven by three signals; an output of share 2MUX 230, an output of 4LUT 220 and a carry-out signal from first adder 132. By including share 2MUX 130, adder 132 can be driven either by the share-in input to LE 100 or an output from 3LUT 122 or 3LUT 124, which together with 2MUX 126 forms a 4LUT. By including share 2MUX 230, adder 232 can be driven either by and output of 2MUX 128 or an output from 3LUT 222 or 3LUT 224, which together with 2MUX 226 forms a 4LUT.

Figure 2:
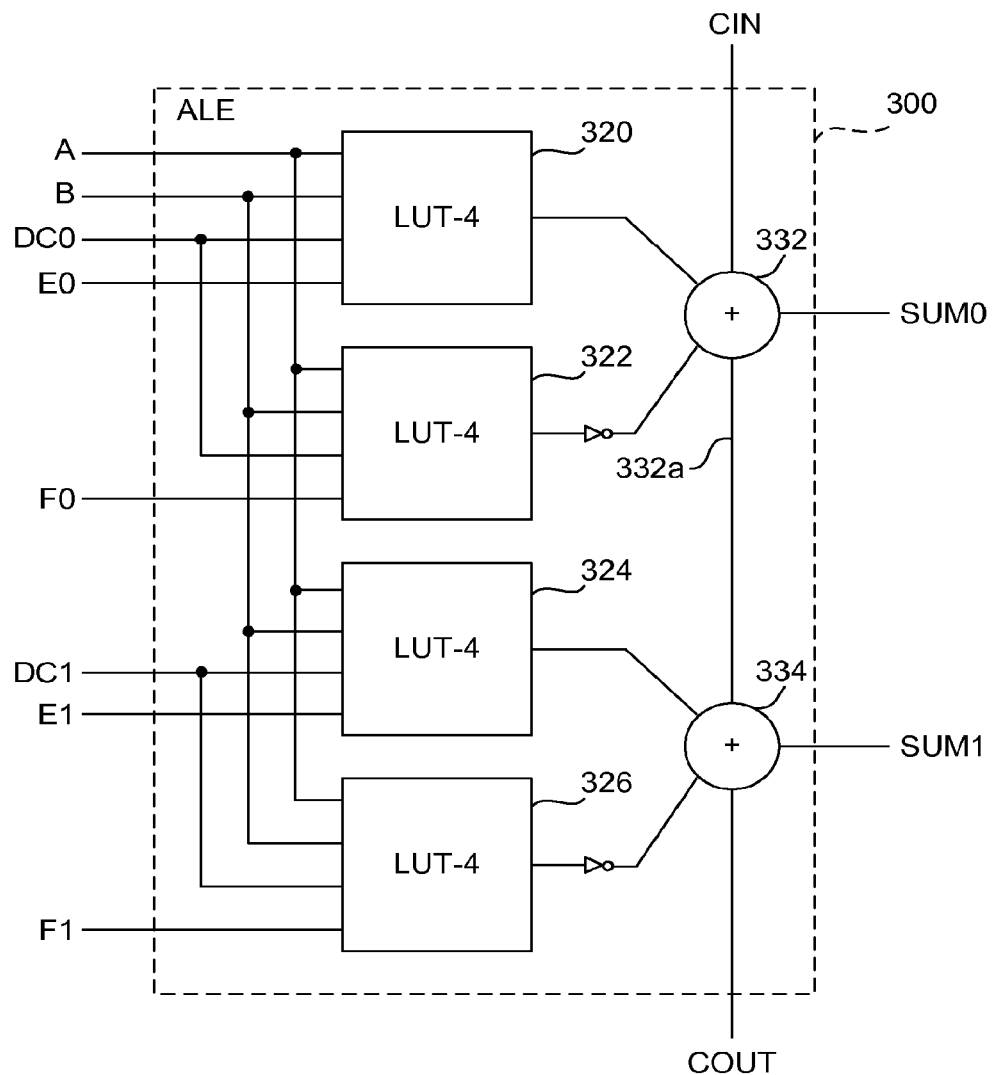
FIG. 2 is a schematic diagram illustrating one configuration of the arithmetic portion of the logic element shown in FIG. 1.

This structure is shown functionally in FIG. 2 in a simplified form out of the context of LE 100. FIG. 2 is a schematic diagram showing arithmetic structure 300, which is the functional arithmetic structure included in LE 100. Arithmetic structure 300 includes first 4LUT 320, which is the equivalent of 4LUT 120, second 4LUT 322, which is equivalent to the 4LUT formed by 3LUT 122, 3LUT 124, and 2MUX 126, 4LUT 324, which is equivalent to 4LUT 220, and 4LUT 326, which is equivalent to the 4LUT formed by 3LUT 222, 3LUT 224, and 2MUX 226. 4LUT 320 is driven by inputs A, B, DC0 and E0; 4LUT 322 is driven by inputs A, B, DC0 and F0; 4LUT 324 is driven by inputs A, B, DC1 and E1; and 4LUT 326 is driven by inputs A, B, DC1 and F1. 4LUTs 320 and 322 drive adder 322, which is the equivalent of first adder 132 and 4LUTs 324 and 326 drive adder 334, which is the equivalent of second adder 232. Adder 332 is also driven by carry input CIN and includes a carry output 332a. Adder 334 is also driven by carry output 332a of adder 332 and includes a carry out output COUT. Adder 332 also drives output SUM0 and adder 334 also drives output SUM1. Adder 332 provides a result of an addition of outputs of 4LUT 320 and 4LUT 322 and, if present, CIN. In particular, output SUM0 provides a sum bit of the result of this addition and carry output 332a provides a carry-out bit result thereof. Adder 334 provides a result of an addition of output of 4LUT 324 and 4LUT 326 and, if present, carryout output 332a. In particular output SUM1 provides a sum but the result of this addition and carry output COUT provides a carry-out bit result thereof. In this way, adder 332 provides the result of the sum of two functions F1(A, B, DC0, E0) and F2(A, B, DC0, F0) and cin. Similarly, adder 334 provides the result of the sum of two functions F3(A, B, DC1, E1) and F4(A, B, DC1, F1) and 332a the carry output of adder 332.

The configuration shown in FIG. 2 can be implemented in LE 100 by setting a control bit R1 of share 2MUX 130 to pass the signal from 2MUX 126 to the input of adder 132 and by setting a control bit R2 of share 2MUX 230 to pass the signal from 2MUX 226 to adder 232. Input E0 can be configured to drive 4LUT 120 by configuring input 3MUX 170 to pass input EU to 4LUT 120. Additionally, function F2 is made a function of F0 by driving the control input of 2MUX 126 with F0. Input E1 can be configure to drive 4LUT 220 by configuring input 3MUX 270 to pass input E1 to 4LUT 220. And, function F4 is made a function of F1 by driving the control input of 2MUX 226 with signal F1.

By including input 3MUXs 170 and 270 and 2MUXs 126 and 226 to allow the above the arithmetic configuration described above, LE 100 can implement a number of arithmetic functions.

Figure 3:
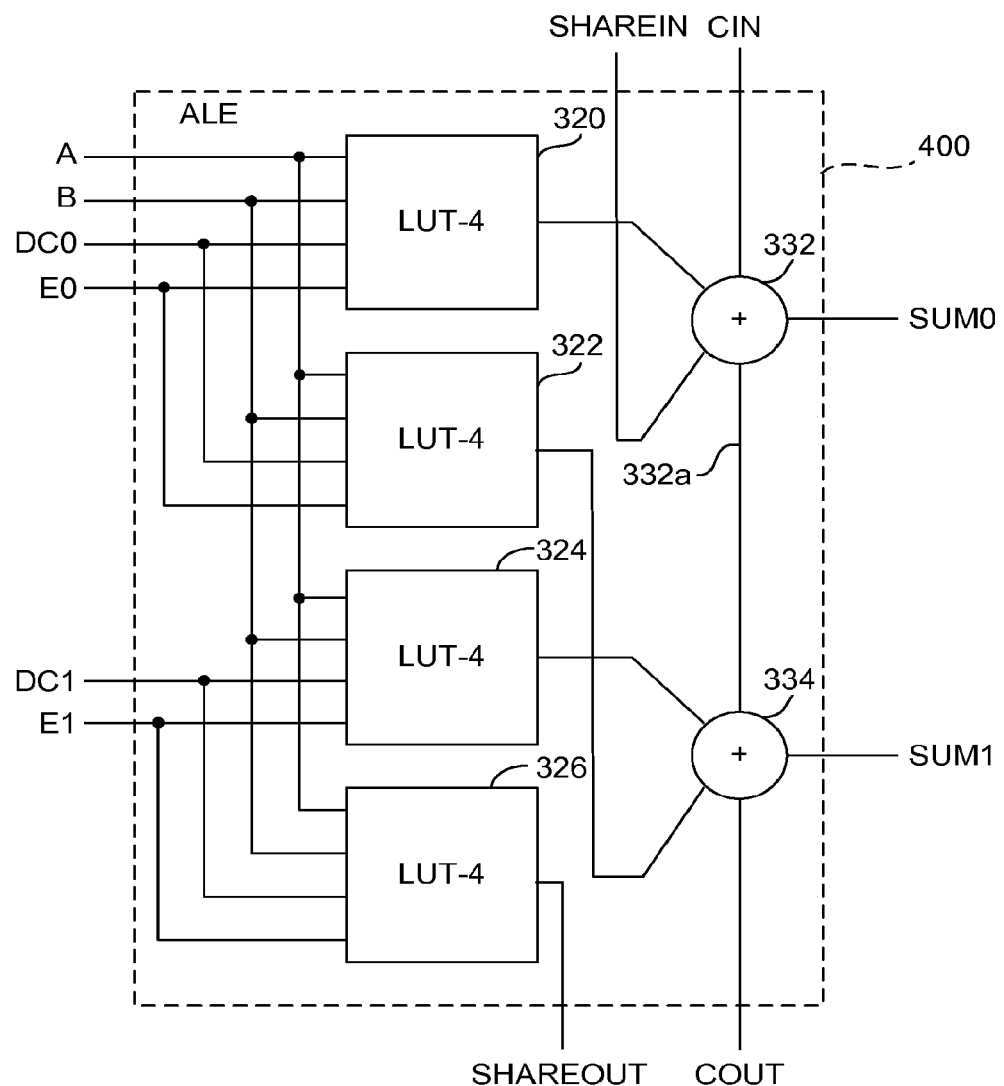
FIG. 3 is a schematic diagram illustrating a second configuration of the arithmetic portion of the logic element shown in FIG. 1.

FIG. 3 illustrates a second functional arithmetic structure in which LE 100 could be configured. In particular, FIG. 3 illustrates a structure for addition of three binary words. Such structures are disclosed in commonly owned pending U.S. Patent Application for Logic Cell Supporting Addition of Three Binary Words, filed Nov. 21, 2003, which is incorporated by reference in its entirety. Functional structure 400 includes 4LUTs 320, 322, 324 and 326 and adders 332 and 334 also shown in FIG. 2. As in FIG. 2, adder 332 is driven by 4LUT 320 and includes a carry-in input CIN. Also, adder 334 is driven by carry-out output 332a of adder 332 and includes a carry-out output COUT. However, adder 332 is also driven by the share-in input to functional structure 400, which is equivalent to the share-in input of LE 100; and adder 334 is driven by 4LUT 322. 4LUT 326 drives a SHAREOUT output of functional structure 400, which is equivalent to the SHAREOUT output of LE100. As with functional structure 300, adder 332 of functional structure 400 drives output SUM0 and adder 334 drives output 334. Additionally, in functional structure 400 both 4LUTs 320 and 324 are driven by inputs A, B, DC0 and EU and both 4LUTs 324 and 326 are driven by inputs A, B, DC1 and E1.

The configuration of functional structure 400 allows addition of three, rather than two, binary numbers at once. There are a number of known techniques for adding three or more binary numbers. One of those techniques is the Carry Save Adder method.

Figure 4:
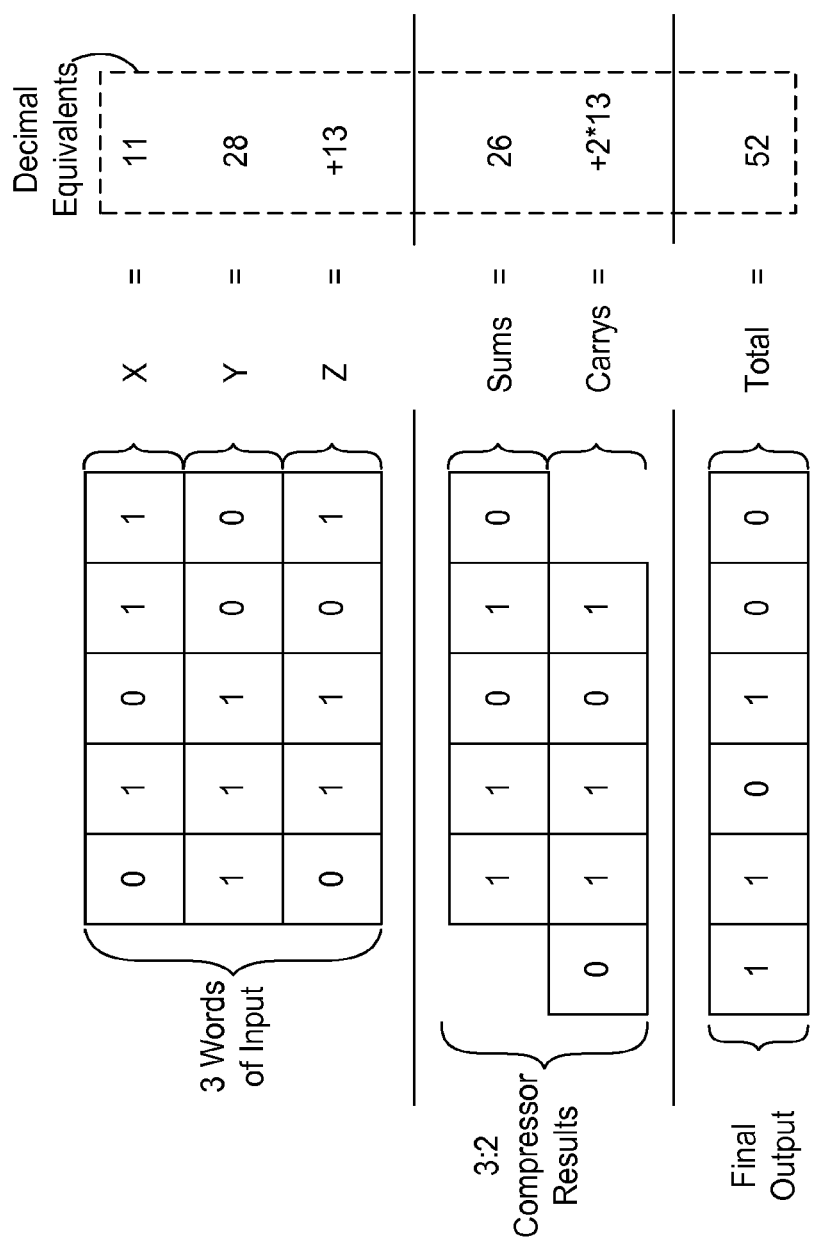
FIG. 4 illustrates the addition of three binary numbers carried out by the arithmetic configuration shown in FIG. 3.

FIG. 4 illustrates the concept of Carry Save Adder method. As illustrated in FIG. 4, in the Carry Save Adder method, three binary words, X, Y, and Z, are compressed into sums and carrys output vectors using an array of full adders. In some cases, arrays of independent adders are used to produce the sums and carrys output vectors. Each bit of the sums vector represents the binary sum result of adding the corresponding bits of the binary numbers X, Y, and Z.

Each bit of the carrys vector represents the binary carry result of adding the corresponding bits of the binary numbers X, Y, and Z. Thereafter, the carrys vector is shifted to the left by one bit, thus effectively multiplying it by 2. The sums and the shifted carrys are also referred to as the 3:2 compressor results. The sums vector and the shifted carrys vector are then added to generate the final output, which is also referred to as the total in FIG. 4. In FIG. 4, the decimal equivalents of the binary numbers X, Y, Z, as well as the sums, carrys, and total are shown to the right of their corresponding binary numbers.

In FIG. 3, 4LUTs 320 and 322 provide the sums and carrys results for the n-th bit of the binary numbers X, Y, and Z. In other words, they provide the sums and carrys results for the X[n], Y[n], and Z[n] bits. 4LUTs 324 and 326 provide the sums and carrys results for the (n+1)-th bit of the binary numbers X, Y, and Z. In other words, they provide the sums and carrys results for the X[n+1], Y[n+1], and Z[n+1] bits. The SHAREOUT output and COUT output would drive an adder of an adjacent LE (not shown) which would provide the sums and carrys results for the (n+2)-th bit of the binary numbers X, Y, and Z. In other words, provide the sums and carrys results for the X[n+2], Y[n+2], and Z[n+2] bits.

Adder 332 receives data from LUT 320. If LE 100 of functional structure 400 is part of the first LE in a LAB, then adder 332 also receives ground signals via SHAREIN input. Otherwise, if LE 320 is not the first LE in a LAB, then adder 332 receives the output signals of a carry LUT (i.e., a LUT that determines the carrys for the (n−1)-th bit). Additionally, if n is not the first bit to be output as a result of adding X, Y, and Z, then adder 332 also receives a carry out signal from the previous LE through input CIN. If n is the first bit to be output as a result of adding X, Y, and Z, then adder 332 would receive a ground signal on input CIN. Adder 332 outputs the final result for the n-th bit. It also outputs a carry out signal that is sent to adder 334 via output 332a.

Adder 334 receives data from LUTs 322 and 324. In other words, it receives the carrys for the n-th bit and the sums for the (n+1)-th bit. Moreover, adder 334 receives the carry out signal from adder 332 via output 332a. Adder 334 outputs the final result for the (n+1)-th bit. It also outputs a carry out signal that is sent to an adder in an adjacent LE (not shown) via output COUT.

Each of the Sum LUTs, such as LUT 320 and 324, receives one bit of data from each of the binary numbers X, Y, and Z, and outputs a one bit signal that represents the sum of the three bits received. For example, LUT 320 receives the n-th bit of the binary numbers X, Y, and Z and outputs the sum of those three bits. In other words, it receives the bits X[n], Y[n], and Z[n] and outputs X[n](XOR)Y[n](XOR)Z[n], where XOR represents the Boolean exclusive OR function.

In such an embodiment, with the exception of the first and last LEs in a LAB, each LE in effect lends one LUT to the LE below (i.e., the following LE) and borrows one LUT from the LE above (i.e., the previous LE). The first LE in a chain in effect lends one LUT to the LE below, but does not borrow a LUT. The last LE in a chain in effect borrows one LUT from the LE above, but does not lend a LUT. The LUT being lent or borrowed is one that implements the carry function in the 3:2 compressor model. Adding three binary numbers in this manner can result in savings of both depth and area in an LE.

The configuration shown in FIG. 3 can be implemented in LE 100 by setting control bit R1 of share 2MUX 130 to pass the share-in input to adder 132 and setting control bit R2 of share 2MUX 230 to pass the output of 2MUX 128 to adder 232. Additionally, input 3MUX 170 is configured to pass input E0 to 4LUT 120 and 2MUX 128 and input 3MUX 270 is configured to pass input E1 to 4LUT 220 and 2MUX 228. Thus, by including share 2MUXs 130 and 230 and 3MUXs 170 and 270, along with adders 132 and 232, LE 100 can implement addition of three binary numbers as described above.

A first output 132a of first adder 132 provides a sum bit of the result of an addition and drives 3MUX 158, which can provide the sum bit to first register 150. Output 132a also drives output MUXs 162, 164 and 166, allowing a sum result from adder 132 to be provided directly on one or more of outputs lelocal1, leout1a and/or leout1b without passing through first register 150. As discussed above, a second output of adder 132 provides a carry-out bit of the result of an addition to second adder 232, allowing second adder 232 to be cascaded with first adder 132. A first output 232a of second adder 232 provides a sum bit of the result of an addition and drives 3MUX 258, which can provide the sum bit to second register 250. Output 232a also drives output MUXs 262, 264 and 266, allowing a sum result from adder 232 to be provided directly on one or more of outputs lelocal2, leout2a and/or leout2b without passing through second register 250.

Output Multiplexing

As discussed above, first register portion 112 includes 3 outputs; lelocal1, driven by first output 3MUX 162; leout1a, driven by second output 3MUX 164; and leout1b, driven by third output 3MUX 166. Second register portion 212 also includes 3 outputs; lelocal2, driven by fourth output 3MUX 262; leout2a, driven by fifth output 3MUX 264, and leout2d; driven by sixth output 3MUX 266. Outputs lelocal1 and lelocal2 are intended to drive local lines and outputs leout1a, leout2a, leout1b and leout2b are intended to drive global lines. Output 3MUXs 162, 164 and 166 of first register portion 112 are each driven by the output of first adder 132, an output Q1 of first register 150 and first arithmetic portion output OUT1. Thus, any of these three signals can drive an output of first register portion 112. Output 3MUXs 262, 264 and 266 of second register portion 212 are each driven by the output of second adder 232, an output Q2 of second register 250 and second arithmetic portion output OUT2. Thus, any of these three signals can drive an output of second register portion 212. In this way, the output of arithmetic portions 112 and 212 can be provided directly to any line driven by LE 100.

Although exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

We claim:
1. An integrated circuit (IC) comprising:
  a plurality of logic elements arranged in an array, each of the logic elements including:
    an input-port component receiving a plurality of inputs,
    a programmable logic function component including a first look-up table and a second look-up table sharing the plurality of inputs,
    a fixed logic function component that performs an arithmetic function and couples to at least one of the plurality of inputs, wherein the fixed logic function component contains one or both of a binary adder function and a ternary adder function, wherein:
the logic element can be further configured to connect one or both of
(i) outputs of the programmable logic function component to inputs of the binary adder function; and
(ii) outputs of the programmable logic function component, along with signals taken from adjacent logic elements in the array, to the ternary adder function to perform ternary addition, wherein the signals from adjacent logic elements are routed to additional input ports in an input region of the logic element and the logic element uses these input ports for ternary addition.

2. The IC of claim 1, wherein each logic element comprises a register function component, wherein the register function component of each logic element comprises a register feedback mode wherein, for each logic element, the output of one of the register function elements is fed back into one or more inputs of the logic element.

3. The IC of claim 1 where the signals from adjacent logic elements are dedicated connections.

4. The IC of claim 1, wherein each logic element is further configurable to implement a shift register between a first register and a second register in the logic element.

5. The IC of claim 1, comprising a register component and means for programming the logic element to multiple different functional configurations using multiple different configurations of the input ports to generate multiple results at output ports of the logic element, the register function component including means for computing shift-register functions using an additional dedicated input and output to the logic elements respectively.

6. The IC of claim 5, wherein the register function component of the logic element contains two registers.

7. An integrated circuit (IC) comprising:
a plurality of logic elements arranged in an array, each of the logic elements including an input-port component receiving a plurality of inputs,
a programmable logic function component including a first look-up table and a second look-up table sharing the plurality of inputs,
a fixed logic function component,
wherein
the programmable logic function component is an n-input lookup-table (LUT) containing $2^n$ bits of LUT-mask; and
each logic element is configured to perform a plurality of logic functions, and wherein one of the logic functions performed by each logic element is an incomplete LUT function implementing a partial function of more than n inputs.

8. The IC of claim 7, wherein each logic element is configured to perform a plurality of logic functions, and wherein one of the logic functions performed by each logic element is a complete n-input lookup-table (LUT) using the entirety of the LUT-mask.

9. The IC of claim 7, wherein the number of input ports m is larger than n.

10. The IC of claim 7, wherein the LUT can be programmed to be fractured into two LUT functions each of size n−1 or smaller using a combination of up to n independent and shared input ports to the logic element.

11. The IC of claim 7, wherein the LUT can be programmed to be fractured into two LUT functions each of size n or smaller, using a combination of up to m independent and shared input ports to the logic element.

12. The IC of claim 11, wherein the LUT can be programmed to be fractured into the two LUT functions using exclusively independent input ports to the logic element.

13. The IC of claim 11, wherein the LUT can be programmed to be fractured into the two LUT functions using exclusively shared input ports to the logic element.

14. The IC of claim 11, wherein the logic functions performed by each logic function component comprises configuring the logic element to implement two complete logic functions of n inputs using a combination of shared and independent inputs.

15. An integrated circuit (IC) comprising:
a plurality of logic elements arranged in an array, each of the logic elements including:
an input-port component receiving a plurality of inputs,
a programmable logic function component including a first look-up table and a second look-up table sharing the plurality of inputs,
a fixed logic function component that performs an arithmetic function and couples to at least one of the plurality of inputs, wherein the fixed logic function component contains one or both of a binary adder function and a ternary adder function,
wherein:
the logic element can be further configured to connect one or both of
(i) outputs of the programmable logic function component to inputs of the binary adder function; and
(ii) outputs of the programmable logic function component, along with signals taken from adjacent logic elements in the array, to the ternary adder function to perform ternary addition, wherein each logic element is further configurable to implement a shift register between a first register and a second register in the logic element.

16. The IC of claim 15, wherein the signals from adjacent logic elements are routed to additional input ports in an input region of the logic element and the logic element uses these input ports for ternary addition.

17. The IC of claim 15, comprising a register component and means for programming the logic element to multiple different functional configurations using multiple different configurations of the input ports to generate multiple results at output ports of the logic element, the register function component including means for computing shift-register functions using an additional dedicated input and output to the logic elements respectively.

18. The IC of claim 17, wherein the register function component of the logic element contains two registers.

19. The IC of claim 15, wherein each logic element comprises a register function component, wherein the register function component of each logic element comprises a register feedback mode wherein, for each logic element, the output of one of the register function elements is fed back into one or more inputs of the logic element.

20. The IC of claim 15, wherein the signals from adjacent logic elements are dedicated connections.

* * * * *